United States Patent [19]
Seifert

[11] Patent Number: 6,085,025
[45] Date of Patent: Jul. 4, 2000

[54] ELLIPTICAL CERAMIC EVAPORATORS

[75] Inventor: Martin Seifert, Kempten, Germany

[73] Assignee: Elektroschmelzwerk Kempten GmbH, Munich, Germany

[21] Appl. No.: 09/315,320

[22] Filed: May 20, 1999

[30] Foreign Application Priority Data

May 28, 1998 [DE] Germany .......................... 198 23 908

[51] Int. Cl.⁷ .............................. B01D 7/00; C23C 16/00; F27B 14/10
[52] U.S. Cl. ........................... 392/389; 118/726; 432/262
[58] Field of Search .................... 392/388, 389; 118/726, 727; 432/262, 263

[56] References Cited

U.S. PATENT DOCUMENTS

| | | |
|---|---|---|
| 2,773,923 | 12/1956 | Smith ........................................ 373/139 |
| 2,996,412 | 8/1961 | Alexander et al. . |
| 3,514,575 | 5/1970 | Hall et al. ................................. 392/389 |
| 3,636,305 | 1/1972 | Passmore ................................. 392/389 |
| 4,043,748 | 8/1977 | Watanabe et al. ....................... 432/253 |
| 4,089,643 | 5/1978 | Jerabek et al. . |
| 5,395,180 | 3/1995 | Mariner .................................. 392/389 |

OTHER PUBLICATIONS

Patent Abstracts of Japan, vol. 012, No. 479 (C–552) & JP63192860 A (Hitachi Ltd.).

*Primary Examiner*—Sang Paik
*Attorney, Agent, or Firm*—Burgess, Ryan & Wayne

[57] ABSTRACT

An evaporator is provided for the evaporation of metal, which has a cross-sectional area in the region from which evaporation of the metal takes place which is greater than the corresponding cross-sectional area of a triangular evaporator of the same width and height and has, in the specified region, a smaller minimum circumference than a rectangular evaporator having the same width and height.

3 Claims, 2 Drawing Sheets

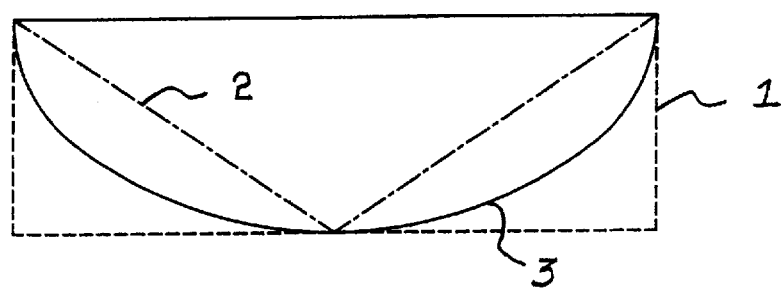
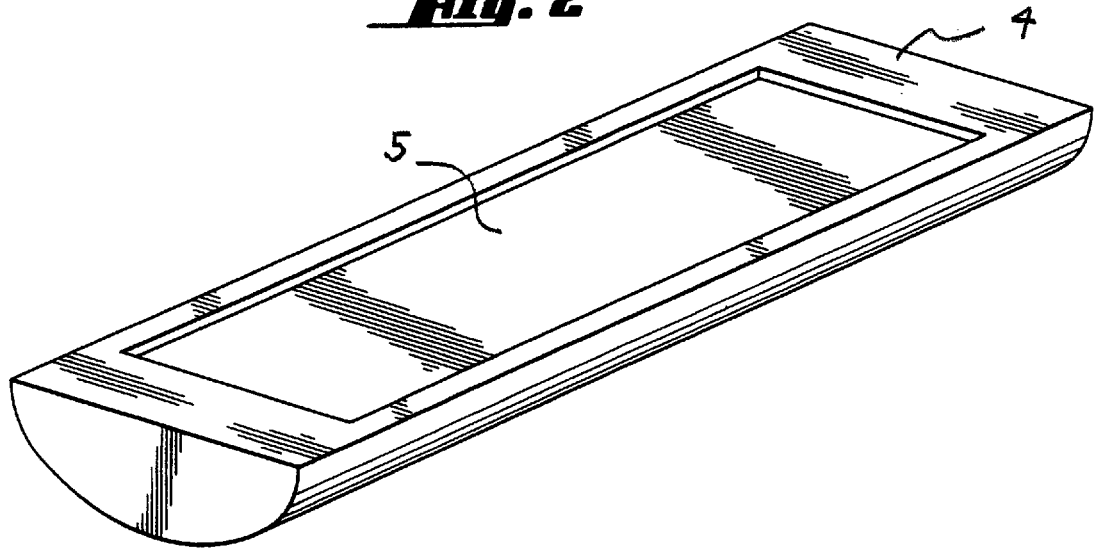

ELLIPTICAL CERAMIC EVAPORATORS

BACKGROUND OF THE INVENTION

1) Field of the Invention

The invention relates to ceramic evaporators.

2) Background Art

The most widely used method of coating flexible substrates with metals, in particular with aluminum, is high-vacuum web coating. The substrate to be coated is passed over a cooled roller and at the same time exposed to aluminum vapor which deposits as a thin metal layer on the substrate surface.

To produce the constant vapor stream required, ceramic evaporators known as evaporation boats, are heated to about 1450° C. by direct passage of electric current. Aluminum wire is continuously fed in, liquefied on the ceramic surface and vaporized at a vacuum of about $10^{-4}$ mbar. In metallization units, a series of evaporation boats are arranged in such a way that a uniformly thick aluminum layer is deposited over the whole width of the substrate.

The chemical composition of the evaporation boats is generally 45–55% by weight of $TiB_2$, 25–55% by weight of BN and 0–20% by weight of AlN. Such compositions are described in various patents (e.g. U.S. Pat. No. 3,915,900 or the patents cited in U.S. Pat. No. 4,089,643, column 1, lines 10 and 11, and column 2, line 5).

The customary shape of evaporation boats is based on a rectangular cross section. The widths and lengths of the evaporation boats are selected in accordance with the required evaporation rate of from about 0.35 to 0.40 g of Al $cm^{-2}$ $min^{-1}$. The rectangular cross section has proved useful because it makes possible a high mechanical stability, even at high temperatures, and inexpensive manufacture.

Evaporators having a non-rectangular cross section have also been described. U.S. Pat. No. 4,089,643 describes evaporators having a triangular cross section and a cavity. Significant advantages of the triangular evaporators over an evaporator having a rectangular cross section are the saving of material and the reduced electric power for operating such an evaporation boat. These advantages are offset by the serious disadvantage of a shorter operating life of the triangular evaporators compared to rectangular evaporators.

SUMMARY OF THE INVENTION

It is an object of the invention to provide a ceramic evaporator for the evaporation of metal which has a lower energy consumption in operation than a rectangular evaporator of the same height, length and width without suffering from the disadvantage of the shorter life of a triangular evaporator of the same height, length and width.

This object is achieved by an evaporator which has a cross-sectional area in the region from which evaporation of the metal takes place which is greater than the corresponding cross-sectional area of a triangular evaporator of the same width and height and at the same time has, in the specified region, a smaller minimum circumference than a rectangular evaporator having the same width and height.

DESCRIPTION OF THE PREFERRED EMBODIMENTS

Preferably, the evaporator of the invention has a minimum circumference for the given height and width in the region from which evaporation of the metal takes place together with a maximum cross-sectional area in the specified region.

Particularly preferably, the evaporator of the invention has the shape of a divided ellipse.

The division of the ellipse is preferably along its principal axis.

One shape of the evaporator of the invention makes possible an angle between the surface from which evaporation takes place and the elliptically shaped side wall of 90°. This makes it possible to omit the process step of grinding down the sharp angle in the region mentioned, as is necessary in the case of a triangular evaporator because of the risk of injury.

The evaporator of the invention requires no special clamping device in the vapor deposition unit to clamp it in place laterally, as is normally necessary for a triangular evaporator.

Likewise, the additional process step of specially machining the ends of the evaporator which is necessary for triangular evaporators as an alternative to a special clamping device and is described, for example, in DE 197 08 599 C1, becomes unnecessary.

Thus, the production of an evaporator according to the invention requires no increased machining effort or amount of material as is the case for triangular evaporators described in the above patent.

The evaporator of the invention suffers from none of the disadvantages mentioned since it can, for example, be produced in a simple way from a customary rectangular evaporator by means of a grinding process.

Preferably, the length over-which the shape according to the invention is produced corresponds to the clamping spacing of the evaporator in the vapor deposition unit.

This makes it possible for the evaporator of the invention to again have, very simply, a rectangular cross section in the region where it is clamped and thus to be employed without problems in tape coating units for conventional standard rectangular evaporators.

However, it is likewise possible to grind the entire length of the evaporator to the shape according to the invention. Such evaporators can be used, for example, in vapor deposition units with end-face clamping of the evaporation boats.

Furthermore, the machining of a cavity into the evaporator can be omitted in the case of the evaporators of the invention. Of course, it is also possible to machine a cavity into the evaporator as is known in the prior art.

BRIEF DESCRIPTION OF THE DRAWINGS

FIG. 1 shows a comparison of the cross sections of two evaporators of the prior art (rectangular evaporator (1), triangular evaporator (2)), and an evaporator according to the invention (elliptical evaporator (3)). None of the evaporators has a cavity.

FIG. 2 schematically shows an example of an evaporator (4) according to the invention with cavity (5), which is suitable for clamping by the end faces.

Figure 3:
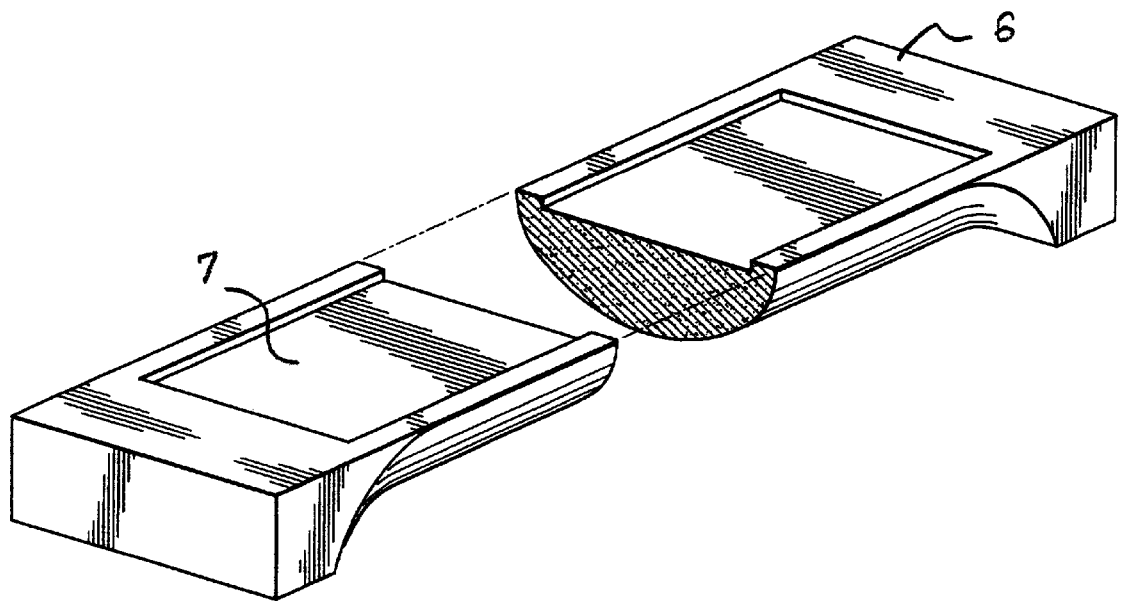
FIG. 3 schematically shows an example of an evaporator (6) according to the invention with cavity (7), which is suitable for lateral clamping. To show the elliptical shape more clearly, the evaporator is also shown in section in FIG. 3.

The following examples illustrate the invention.

EXAMPLE 1

Production of an Evaporator According to the Invention

An evaporator according to the invention having an elliptical cross section was ground from a rectangular evaporator (10×30×120 mm) commercially available from Elektroschmelzwerk Kempten GmbH, Munich (ESK) under the name DiMet Typ5 by means of an elliptically shaped grinding wheel.

EXAMPLE 2

Comparison of a Rectangular Evaporator and an Elliptical Evaporator

An evaporator as described in Example 1 and an evaporator as was used in Example 1 for producing the evaporator according to the invention were compared as follows.

The evaporators were clamped by the end faces into a test evaporation unit. Before heating, 2 g of Al wire were laid on the middle of the surface of the evaporation boat from which metal evaporation is to take place. A vacuum of $<1\times10^{-4}$ mbar was applied. In this high vacuum, the evaporation boats were slowly heated until the aluminum melted. The electric power (product of current and voltage) required at this point in time was determined.

Result:

Rectangular cross section: 5.6 volt/610 ampere=3.42 KW

Elliptical cross section: 5.8 volt/525 ampere=3.05 KW

The result demonstrates that the evaporator having an elliptical cross section requires about 11% less energy for wetting with aluminum.

I claim:

1. An evaporator for the evaporation of metal which has a cross-sectional area in the shape of a halved ellipse in a region from which evaporation of a metal takes place which is greater than a corresponding cross-sectional area of a triangular evaporator of a same width and height and has, in a specified region, a smaller minimum circumference than a rectangular evaporator having the same width and height.

2. An evaporator as claimed in claim 1 which has a minimum circumference and maximum cross-sectional area for the given height and width in the region from which evaporation of the metal takes place.

3. An evaporator as claimed in claim 1 whose cross section has the shape of an ellipse which has been halved along its principal axis.

* * * * *